(12) United States Patent
Broomall et al.

(10) Patent No.: US 6,997,753 B2
(45) Date of Patent: Feb. 14, 2006

(54) APPARATUS, SYSTEM AND METHOD FOR IMPROVED CALIBRATION AND MEASUREMENT OF DIFFERENTIAL DEVICES

(75) Inventors: James R. Broomall, Newark, DE (US); Kailash C. Garg, Newark, DE (US); Thomas A. Clupper, Landenberg, PA (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 10/689,589

(22) Filed: Oct. 22, 2003

(65) Prior Publication Data
US 2005/0090152 A1 Apr. 28, 2005

(51) Int. Cl.
*H01R 25/00* (2006.01)

(52) U.S. Cl. .................................................. 439/638

(58) Field of Classification Search ................ 439/638, 439/502, 579, 578, 284, 320; 324/754, 692, 324/600, 72.5, 601, 538, 415; 379/402
See application file for complete search history.

(56) References Cited

U.S. PATENT DOCUMENTS

| | | | | |
|---|---|---|---|---|
| 4,263,549 A * | 4/1981 | Toppeto | .................... | 324/127 |
| 4,687,279 A * | 8/1987 | Holland et al. | ............. | 439/578 |
| 4,824,399 A * | 4/1989 | Bogar et al. | ................ | 439/578 |
| 4,967,173 A * | 10/1990 | Watson | ........................ | 333/260 |
| 5,127,843 A * | 7/1992 | Henry et al. | ................ | 439/320 |
| 5,139,438 A * | 8/1992 | Gaffney | .................... | 439/269.2 |
| 5,457,784 A * | 10/1995 | Wells et al. | ................... | 710/9 |
| 5,561,378 A * | 10/1996 | Bockelman et al. | ........ | 324/754 |
| 5,632,634 A * | 5/1997 | Soes | .......................... | 439/101 |
| 5,785,550 A * | 7/1998 | Leshem et al. | ............. | 439/497 |
| 5,793,213 A * | 8/1998 | Bockelman et al. | ........ | 324/601 |
| 5,823,795 A * | 10/1998 | Schumacher | ................ | 439/76.1 |
| 5,890,922 A * | 4/1999 | Buchter et al. | ............. | 439/284 |
| 5,906,511 A * | 5/1999 | Bozzer et al. | .............. | 439/579 |
| 6,060,888 A * | 5/2000 | Blackham et al. | .......... | 324/601 |
| 6,065,079 A * | 5/2000 | Dupuy | ....................... | 710/305 |
| 6,191,594 B1 * | 2/2001 | Nightingale et al. | ........ | 324/754 |
| 6,222,380 B1 * | 4/2001 | Gerowitz et al. | ............. | 326/38 |
| 6,250,936 B1 * | 6/2001 | Armistead et al. | ............ | 439/98 |
| 6,347,382 B1 * | 2/2002 | Nakayama et al. | ........... | 714/37 |
| 6,380,485 B1 * | 4/2002 | Beaman et al. | ........... | 174/88 R |
| 6,452,254 B1 * | 9/2002 | Bosch et al. | ................ | 257/664 |
| 6,477,769 B1 * | 11/2002 | Lamatsch et al. | ............. | 29/861 |
| 6,522,115 B1 * | 2/2003 | Greitschus | ................... | 323/288 |
| 6,527,591 B1 * | 3/2003 | Oross | .......................... | 439/638 |
| 6,533,618 B1 * | 3/2003 | Aekins | ........................ | 439/676 |
| 6,577,139 B1 * | 6/2003 | Cooper | ........................ | 324/600 |
| 6,594,416 B1 * | 7/2003 | Sargent et al. | ................. | 385/24 |
| 6,603,297 B1 * | 8/2003 | Gessford et al. | ........... | 324/72.5 |
| 6,636,058 B1 * | 10/2003 | Lyford | ........................ | 324/754 |
| 6,741,644 B1 * | 5/2004 | Dehghan et al. | ............ | 375/229 |
| 6,760,434 B1 * | 7/2004 | Rezvani et al. | ............. | 379/402 |
| 6,786,764 B1 * | 9/2004 | Sivertsen | ..................... | 439/502 |
| 6,786,773 B1 * | 9/2004 | Oross | .......................... | 439/638 |
| 6,802,722 B1 * | 10/2004 | Tafoya et al. | ................. | 439/79 |
| 6,826,506 B1 * | 11/2004 | Adamian et al. | ........... | 702/118 |
| 6,907,615 B1 * | 6/2005 | Alexander et al. | ............ | 725/80 |

\* cited by examiner

*Primary Examiner*—Alexander Gilman

(57) ABSTRACT

An apparatus, system and method for facilitating the calibration and measurement of differential devices by a variety of laboratory fixtures. An adapter is used to transition the connection of standard coaxial interfaces to a hermaphroditic differential interface while compensating for discontinuities on impedance at the connection. The adapter includes a transition region with conductors and shield dimensions that compensate for the discontinuity in impedance. The adapter has pin and socket inputs so that a mated pair of the adapters provides an insertable device for test and measurement on a four port vector network analyzer.

3 Claims, 7 Drawing Sheets

APPARATUS, SYSTEM AND METHOD FOR IMPROVED CALIBRATION AND MEASUREMENT OF DIFFERENTIAL DEVICES

FIELD OF THE INVENTION

The present invention is directed generally to adapters and connectors used to facilitate differential S-parameter calibration and measurement of differential devices by a variety of laboratory fixtures.

BACKGROUND OF THE INVENTION

The design of the coaxial interfaces and coaxial transmission lines is a well understood art. For a given impedance, the geometry of a differential transmission line is readily calculated using a two dimensional field solution algorithm. When making measurements of differential devices, the measurement instruments typically have 50 Ohm coaxial interfaces appropriate for the frequency band of interest.

However, most calibration procedures make measurements at single-ended ports, whether using PCB probes or some other measurement device. When the differential device is measured, the conversion from single-ended to differential propagation takes place at the transition from the calibration ports to the differential device under test (DUT). Any imbalance or mode conversion that takes place at this transition becomes a part of the measurement itself. Thus, there are advantages of making the transition within an adapter or connector to present a differential interface to the DUT.

Moreover, in order to more accurately measure differential devices, it is desirable to convert from the coaxial instrument ports to the differential interface geometry of the DUT before attachment to the DUT in a way that includes the conversion as part of the calibration procedure.

Thus, it would be advantageous to have an adapter or connector that provides a connection between coaxial to differential environments and compensate for discontinuities in impedance at the transition.

SUMMARY OF THE INVENTION

With the foregoing in mind, the present invention provides an apparatus, system and method for converting single-ended signals of a first device having coaxial interfaces to a differential signal of a second device having a differential interface while maintaining uniform differential impedance. Specifically, the present invention utilizes an adapter with at least two coaxial interfaces for coupling to coaxial devices; conductors for transmitting signals through the adapter; a transition region for providing a connection between coaxial and differential transmission environments and for maintaining a uniform differential impedance at the connection; and a differential interface for coupling to a differential device.

In one aspect of the invention, the coaxial interfaces are standard precision coaxial interfaces, such as a 3.5 millimeter coaxial interface, that converge at an angle to form at least one differential line inside the adapter. The angle of convergence, which is the angle between the axis of the coaxial interface and the axis of the differential device, of the coaxial interfaces may vary from approximately 0 to 90-degrees, with a preferred angle of 10-degrees. Additionally, the transition region includes conductors and shield dimensions that compensate for the differential impedance discontinuity at the connection between the coaxial and differential environments, and provides variations in the diameter and dimensions of the conductors. The transition region further includes a dielectric support structure at or near said connection between the coaxial and differential transmission environments. In a preferred embodiment, the differential interface has a 4 millimeter outer diameter with hermaphroditic pin and socket signal contact and means for mating to other devices for measurement with a 4-port vector network analyzer or a variety of other instrumentation such as a signal generator, oscilloscope or a 2-port time domain reflectometer.

In another aspect of the invention, the conversion from single-ended coaxial to differential propagation as well as compensation for differential impedance discontinuity is achieved prior to connection to a DUT. More specifically, the method for converting from single-ended coaxial propagation to differential propagation involves coupling at least two coaxial transmission lines from a first device to at least two coaxial interfaces of an adapter. The adapter provides a connection between coaxial and differential transmission environments and compensates for differential impedance discontinuity within a transition region. The adapter is then coupled at a differential interface to a differential device. To this end, the discontinuities in impedance are compensated for prior to connection to the differential device.

BRIEF DESCRIPTION OF THE DRAWINGS

The accompanying figures best illustrate the details of the apparatus, system and method of the present invention. Like reference numbers and designations in these figures refer to like elements.

DETAILED DESCRIPTION OF THE INVENTION

Figure 1:
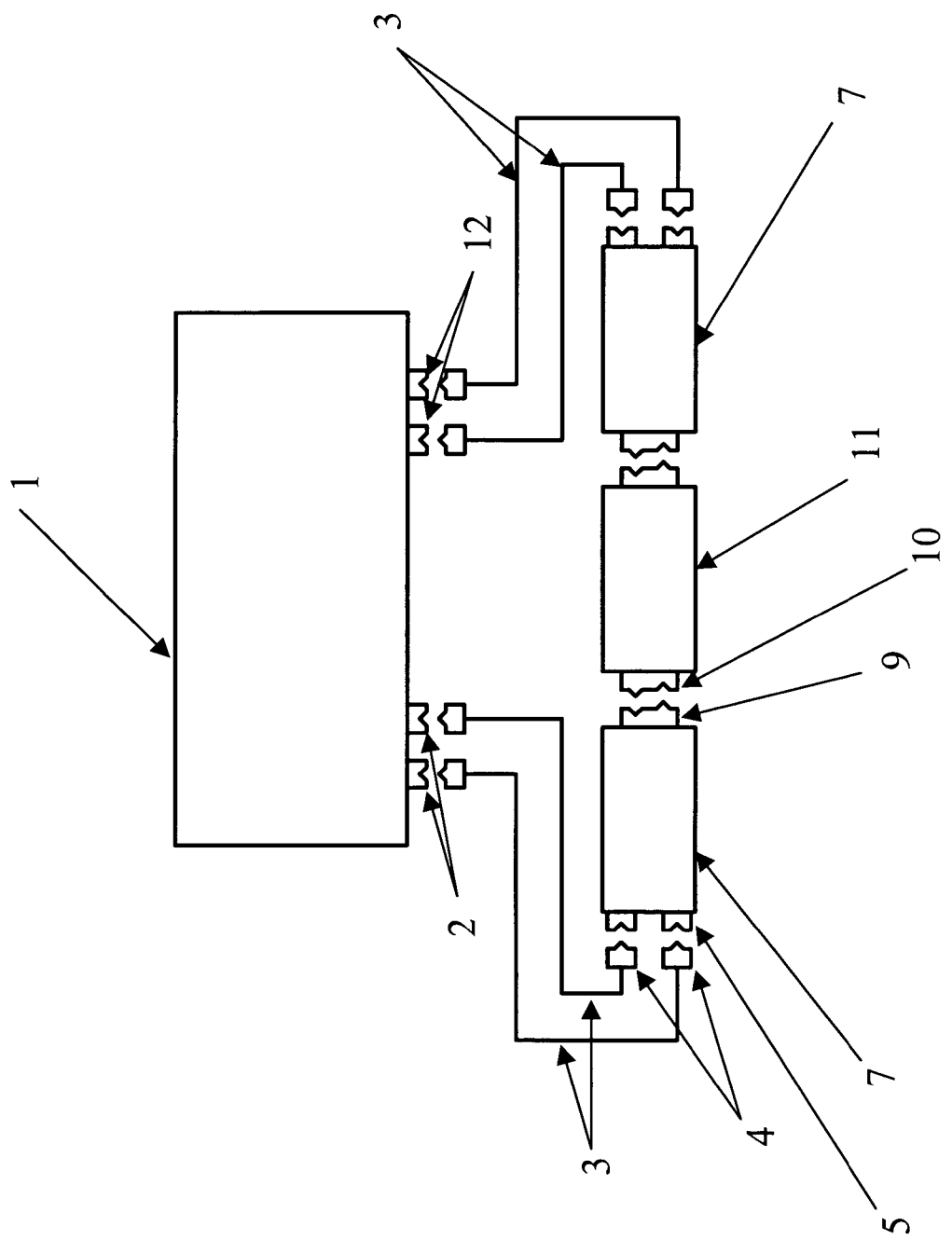
FIG. 1 is a system drawing in accordance with an embodiment of the present invention.

FIG. 1 depicts a system diagram in accordance with an embodiment of the present invention. In FIG. 1, a four-port vector network analyzer (VNA) 1 is connected to the first of two differential adapters 7 via two coaxial interconnect cables 3. While a four-port VNA 1 is shown in FIG. 1, a scenario in which the system includes instrumentation, such as a signal generator, oscilloscope or time domain reflectometer having single-ended ports, for interfacing with a differential device is also contemplated. One end of the coaxial interconnect cables 3 is connected to the VNA at respective coaxial outputs 2 while the other end of the coaxial interconnect cable 3 is connected to the differential adapter 7 on one end at respective coaxial interfaces 5 using coaxial connectors 4 on the ends of the cable 3. For simplification, the coaxial interfaces 5 of the adapter 7 appear parallel. However, the coaxial interfaces 5 may converge at variable angles with respect to each other. The coaxial interfaces 5 of differential adapter 7 accommodate connection of standard precision coaxial control interfaces, such as those with a 1.0 millimeter, 1.85 millimeter, 2.4 millimeter, 3.5 millimeter or 7 millimeter shield inner diameter or any other calibratable, compatible substitutes to a hermaphroditic differential interface. Furthermore, one of ordinary skill in the art will recognize that other compatible, non-precision interfaces that are either coaxial or differential in nature may be used to provide a suitable product.

One end of the differential adapter 7 also includes a differential interface 9 that is connected to one end of the DUT 11 via a differential connector 10. In a preferred embodiment, the differential interface 9 of the differential adapter 7 has a 4 millimeter outer diameter with hermaphroditic pin/socket signal contacts (not shown). One of ordinary skill in the art will recognize that differential adapters having larger or smaller outer diameters may be used. For mechanically coupling differential interfaces, 7 millimeter hermaphroditic or other suitable couplings (not shown) can also be used. The differential interface 9 also incorporates alignment pins (not shown in FIG. 1) to provide registration of the signal contact prior to mating with another device. The other end of the DUT 11 is attached to one end of the second differential adapter 7. The second adapter is then connected to the coaxial inputs 12 of the VNA 1 via a second set of coaxial interconnect cables 3. This system setup can be used to perform s-parameter calibration and measurements of differential devices. Using two coaxial to differential adapters 7 of the present invention, calibration can be performed without the DUT 11 being attached in the circuit. A detailed explanation of the characteristics of the differential adapter that make this possible will be presented in the figures that follow.

Figure 2:
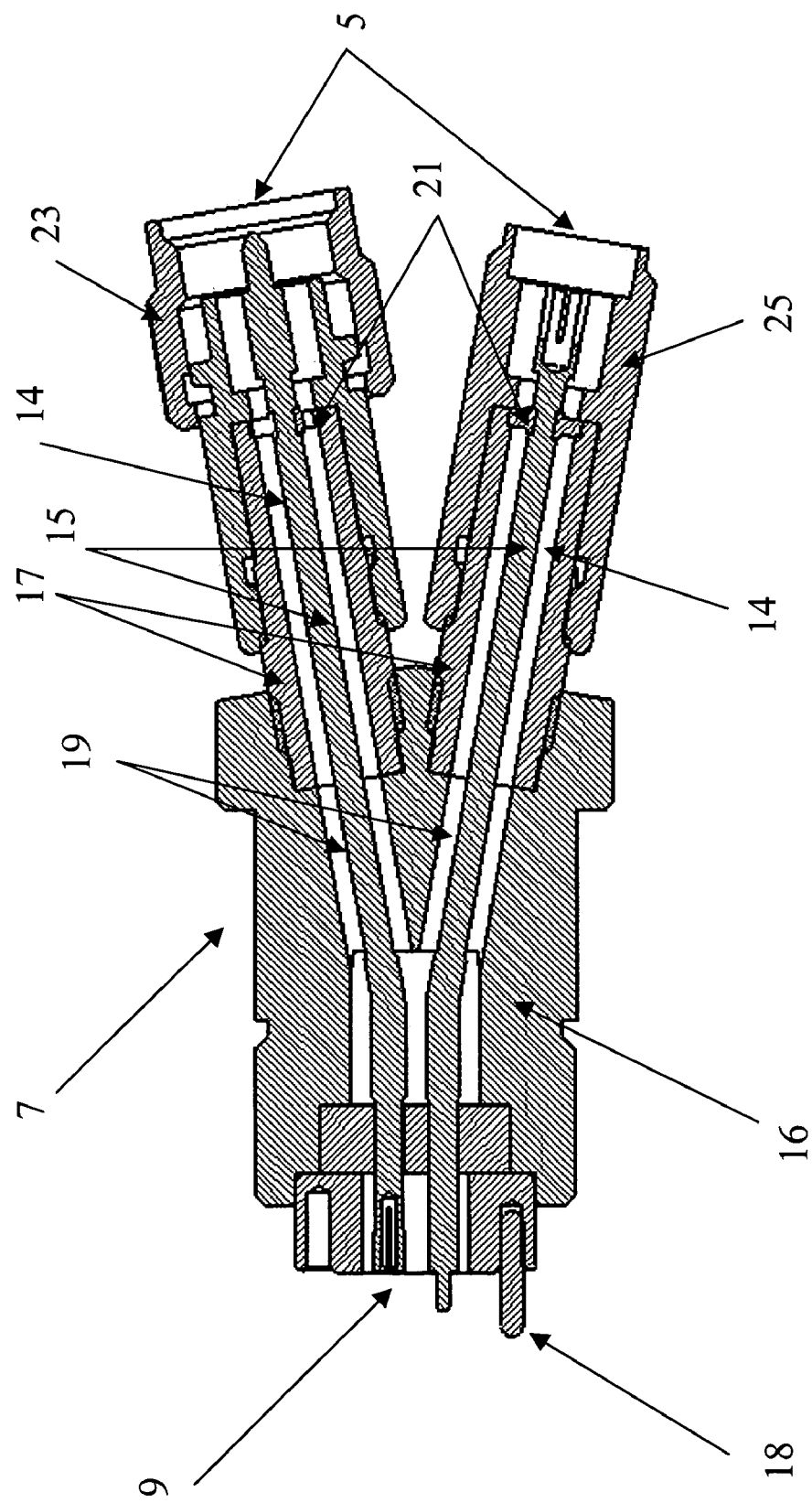
FIG. 2 is a detailed drawing of the differential adapter in accordance with an embodiment of the present invention.
Figure 3:
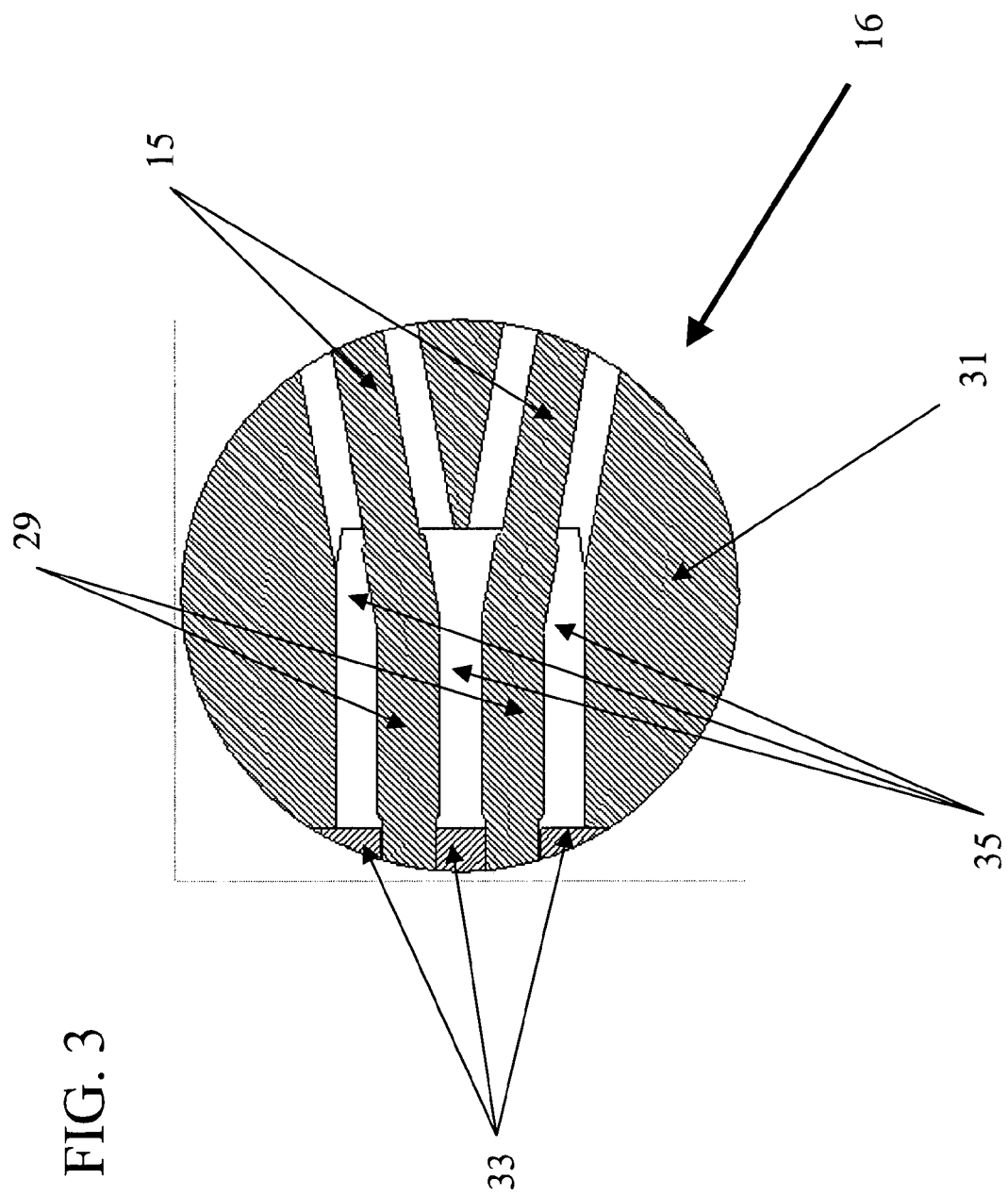
FIG. 3 is a detailed drawing of the transition region of the differential adapter in accordance with an embodiment of the present invention.

FIG. 2 provides a more detailed drawing of the differential adapter 7 in accordance with an embodiment of the present invention. Specifically, this view shows a complete differential adapter 7 with two coaxial interfaces or ports 5 consisting of inner signal conductors 15 and outer conducting shields 17 separated by air dielectric 14. Each inner conductor 15 is supported by a dielectric bead 21. The coaxial interfaces 5 incorporate a coupling mechanism, either a coupling nut 23 or a coupling thread 25. The center section of differential adapter 7, shown in detail in FIG. 3, illustrates the transition region 16 of the differential adapter 7. This portion of the differential adapter is referred to as the transition region because it provides the transition from coaxial to differential transmission lines. The differential interface 9 on the left is shown in detail in FIG. 4a.

FIG. 3 depicts the bifurcated transmission line transition from dual coaxial lines, having independent signal conductors 15, to a single differential transmission line having electrically coupled signal conductors 29. Each coaxial line must be dimensioned such that they have equal impedance values that combine to produce a differential impedance equal to that of the differential impedance of the single differential transmission line. The transition region 16 where the coaxial conductors and differential transmission lines meet has signal conductor and shield conductor 31 dimensions fabricated so that the differential impedance discontinuity caused by the juncture is compensated to maintain a uniform differential impedance. There is an air space 35 between the differential conductors 29 and the shield conductor 31. Note that within the transition region 16, the independent signal conductors 15 from the coaxial lines and the differential signal conductors 29 may be constructed from a single conductor. Alternatively, for the ease of manufacturing, within the transition region 16, the independent signal conductors 15 may be joined to differential signal conductors 29 by couplers well known in the art such as a pin and socket or by splicing. In other embodiments, a dielectric supporting structure 33 for supporting the signal conductors is incorporated at or near the juncture and/or a splice in the signal conductors to facilitate fabrication of the adapter. The impedance discontinuities caused by such alternative constructions are accommodated by additional dimensional modifications of the signal conductors or the outer conducting shield to provide the appropriate impedance compensation.

Figure 4A:
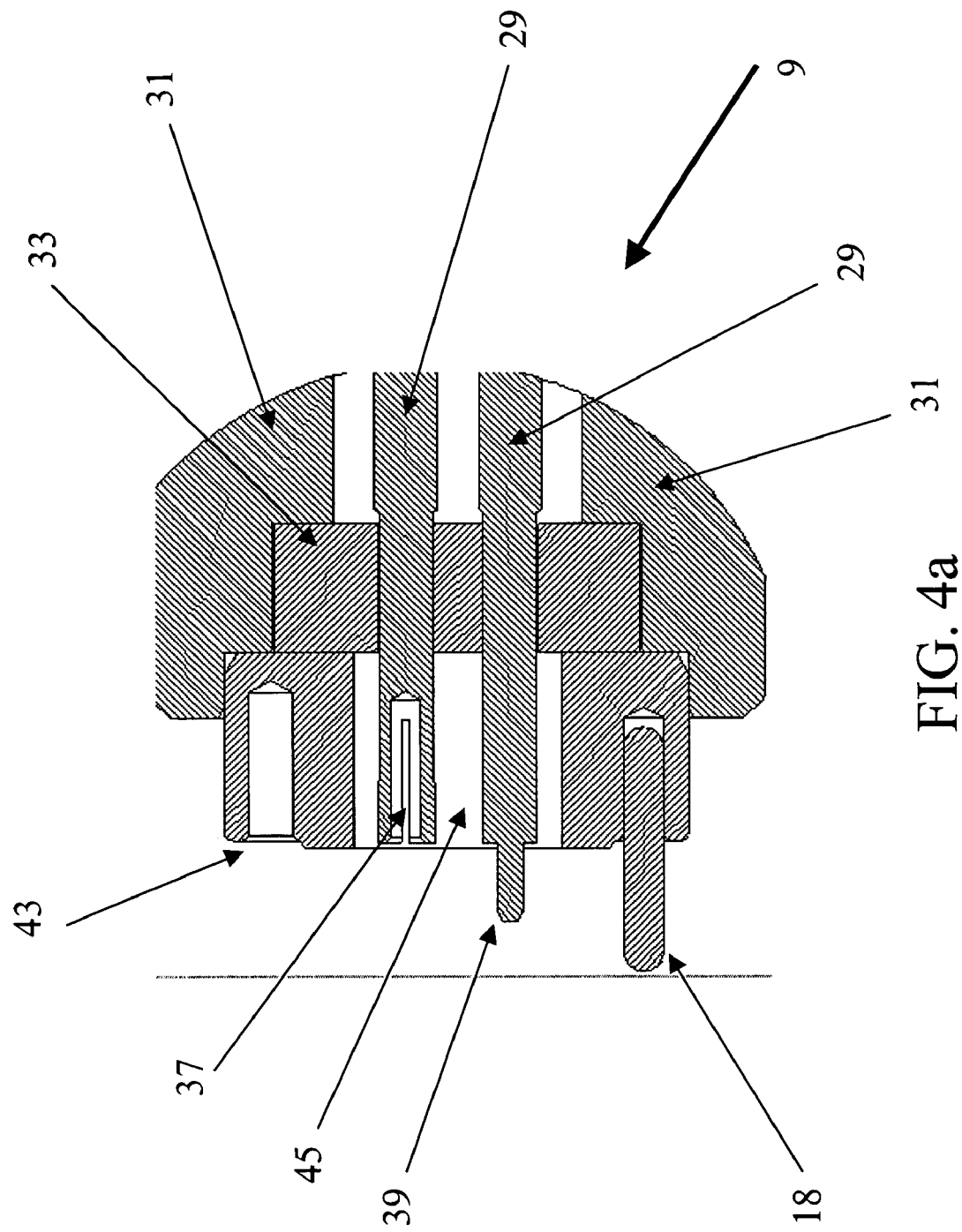
FIG. 4a is a detailed drawing of the differential interface of the differential adapter in accordance with an embodiment of the present invention.

FIG. 4a provides a more detailed view of the differential interface 9 to other differential DUTs. The two differential signal conductors 29 are supported relative to the conducting shield 31 by a dielectric support structure 33. The two differential signal conductors 29 have been configured here such that one presents a female jack 37 for joining to a mating connector's conductor. The other conductor has a male plug 39. At the interface surface, an alignment pin 18 and alignment hole 43 provide the capability to correctly align the conductors 29 to ease joining to a mating connector and to maintain the differential impedance through the interface 10. The alignment pin 18 serves two purposes in addition to ensuring correct alignment. First, the length of the alignment pin 18 is longer than the male plug 39, providing a level of protection to the latter. Second, when two adapters are mated through each adapter's differential interface 9, proper mating of each specific signal conductor is achieved. If a male and male differential interface is employed rather than a hermaphroditic interface, two alignment pins may be provided on the male and male interface with two alignment holes provided on the mated female and female interface.

Between the conductors 29 within the differential interface 9 is an air space 45. This air space 45 allows for a particular type of calibration that uses a length of "unsupported" transmission line, often referred to as an "air line", which is essentially two differential interfaces situated back to back with a length of transmission line between the differential interfaces. The signal conductors 29 are supported by the pin or male plug 39 and socket of female jack 37 connections at each end.

The relative dimensions and spacing of the signal conductors 29 within the differential interface 9 will now be described. The signal conductors 29 have a diameter that is approximately one-quarter of the inner diameter of the shield conductor 31 at the interface. Furthermore, each of the signal conductor's 29 center axis is spaced approximately equidistant between the inner surface of the shield conductor 31 at the interface and the center axis of the shield conductor 31. Thus, if the shield conductor 31 has an inner diameter of "4A", then the signal conductors 29 are each placed on a line passing through the axis of the shield conductor 31 and each signal conductor axis is a distance "A" away from the shield conductor 31 inner surface and "2A" away from each other. These dimensions along with the conductor placement provide the most stable differential impedance with respect to slight variations of conductor placement.

While the differential interface 9 may be hermaphroditic, they may not be, depending on the application. The differential interface 9 may provide either both sexes of contacts or two contacts of the same sex. While a hermaphroditic interface may be preferable, in some situations, contacts of the same sex may be useful as well. Use of a hermaphroditic interface does allow mating of any two connectors without regard for the sex of the connector.

Figure 4B:
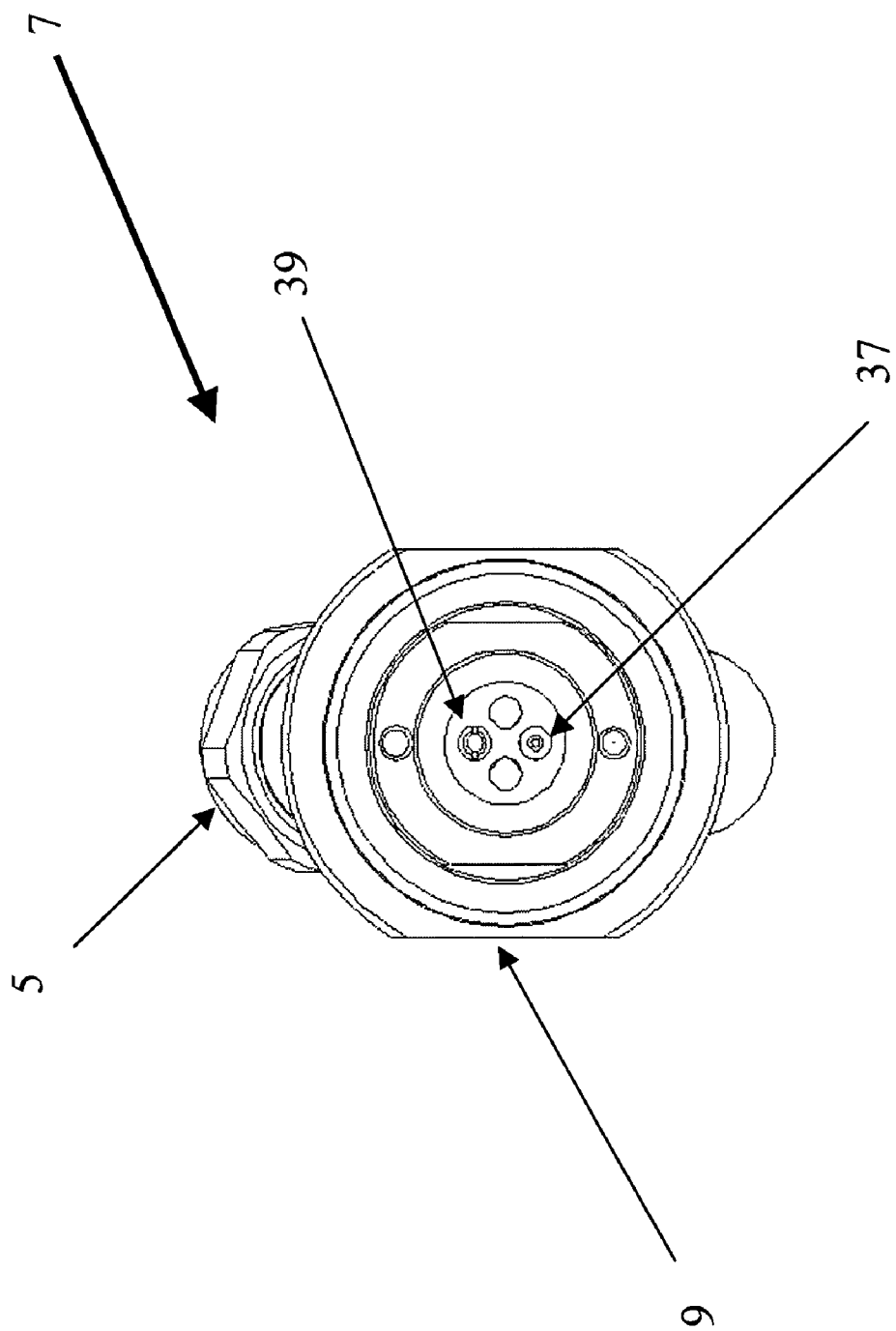
FIG. 4b provides a view of the differential interface end of the differential adapter.

FIG. 4*b* provides a view of the differential interface 9 end of the differential adapter 7. From this perspective, one can recognize that the body of the differential adapter 7 is cylindrical in shape.

Figure 5:
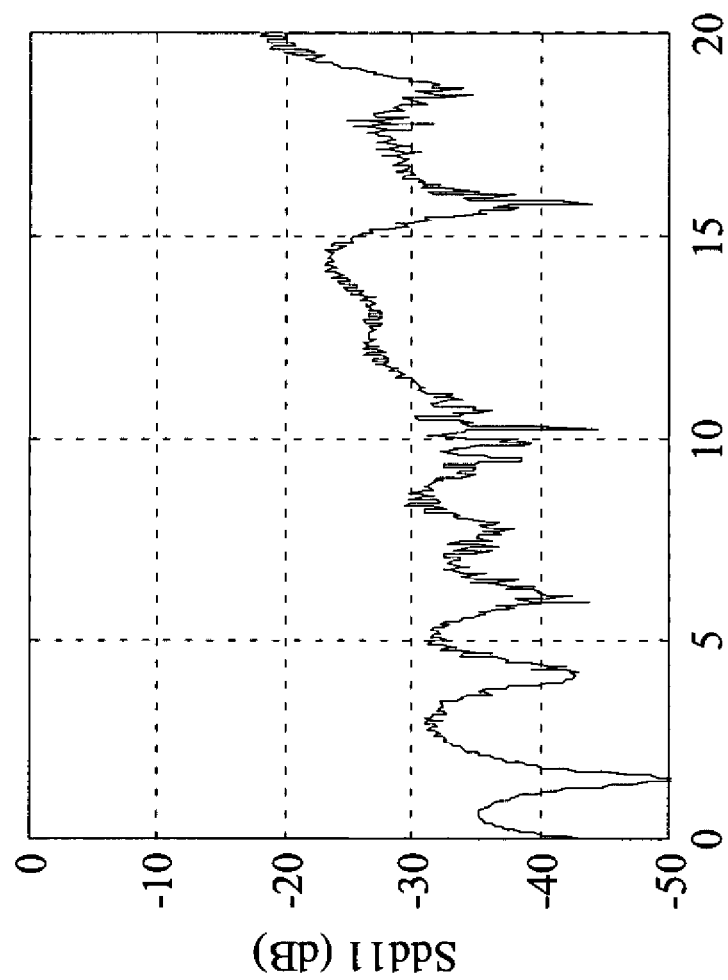
FIGS. 5–7 show graphs of S-parameter data collected in accordance with an embodiment of the present invention.
Figure 6:
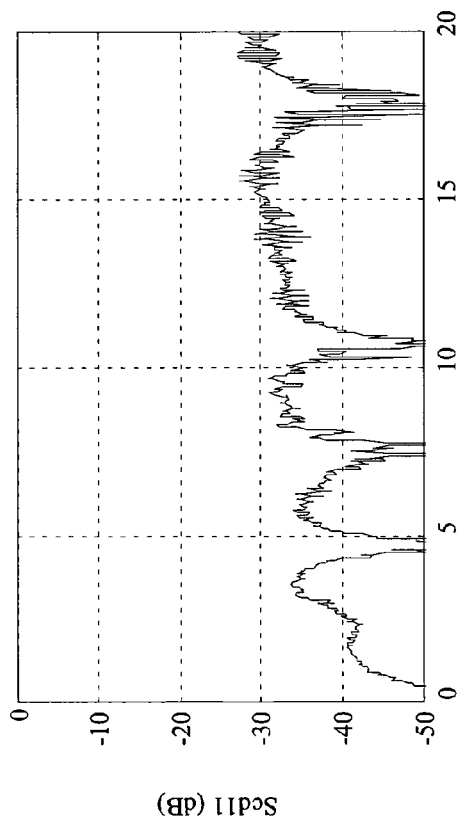
Figure 7:
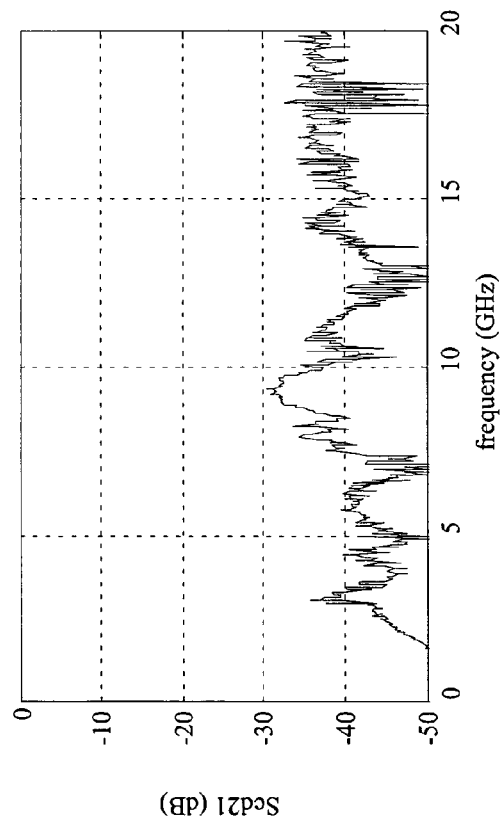

FIGS. 5, 6 and 7 represent various s-parameter data for the differential adapter. FIG. 5 shows a low level of reflection in differential mode passing through a mated pair of the differential adapters of the present invention. The data depicted in FIG. 6 indicate minimal mode conversion by reflection at the input coaxial port of a mated pair of differential adapters. FIG. 7 shows that there is minimal mode conversion during transmission through a mated adapter pair.

Although illustrative embodiments have been described herein in detail, its should be noted and understood that the descriptions and drawings have been provided for purposes of illustration only and that other variations both in form and detail can be added thereupon without departing from the spirit and scope of the invention. The terms and expressions have been used as terms of description and not terms of limitation. There is no limitation to use the terms or expressions to exclude any equivalents of features shown and described or portions thereof.

We claim:

1. An insertable test device, comprising:
a first adapter having a first differential interface; and
a second adapter having a second differential interface, wherein each of the first adapter and second adapter includes at least two coaxial interfaces for coupling to a coaxial device, a first signal conductor for transmitting signals through the adapter, a second signal conductor for transmitting signals through the adapter, a shield conductor, and a transition region for providing a transition between coaxial and differential transmission environments and maintaining a uniform differential impedance through the transition; and the first adapter and the second adapter are mated at the first differential interface and the second differential interface, wherein the mated first adapter and second adapter provides less than −20 dB of differential return loss through 18 gigahertz.

2. The insertable test device of claim 1, wherein the mated first adapter and second adapter provides less than −25 dB of common mode conversion by reflection through 18 gigahertz at the at least two coaxial interfaces of each of the first adapter and the second adapter.

3. The insertable test device of claim 1, wherein less than −30 dB of mode conversion occurs during transmission through the mated first adapter and second adapter.

* * * * *